US012808053B2

(12) United States Patent
Delaney et al.

(10) Patent No.: US 12,808,053 B2
(45) Date of Patent: Nov. 24, 2026

(54) ADVANCED SUSCEPTOR FOR REEL-TO-REEL OPERATIONS

(71) Applicant: MetOx International, Inc., Houston, TX (US)

(72) Inventors: Albert Delaney, Houston, TX (US); Shahab Khandan, Trabuco Canyon, CA (US)

(73) Assignee: MetOx International, Inc., Houston, TX (US)

( * ) Notice: Subject to any disclaimer, the term of this patent is extended or adjusted under 35 U.S.C. 154(b) by 392 days.

(21) Appl. No.: 18/683,934

(22) PCT Filed: Sep. 15, 2022

(86) PCT No.: PCT/US2022/076514
§ 371 (c)(1),
(2) Date: Feb. 15, 2024

(87) PCT Pub. No.: WO2023/049657
PCT Pub. Date: Mar. 30, 2023

(65) Prior Publication Data

US 2025/0223702 A1 Jul. 10, 2025

Related U.S. Application Data

(60) Provisional application No. 63/246,968, filed on Sep. 22, 2021.

(51) Int. Cl.
*C23C 16/46* (2006.01)
*C23C 16/458* (2006.01)
*C23C 16/54* (2006.01)

(52) U.S. Cl.
CPC ............ *C23C 16/46* (2013.01); *C23C 16/458* (2013.01); *C23C 16/545* (2013.01)

(58) Field of Classification Search
CPC ..... C23C 16/458; C23C 16/46; C23C 16/545; C23C 16/4586
See application file for complete search history.

(56) References Cited

U.S. PATENT DOCUMENTS 5,006,505 A 4/1991 Skertic
5,041,188 A 8/1991 Myrosznyk
8,148,300 B2 4/2012 Matsumoto
8,682,406 B2 3/2014 Selvamanickam
2005/0223983 A1* 10/2005 Selvamanickam ... C23C 16/408 427/255.28
2012/0180725 A1* 7/2012 Yasunaga ............ C23C 16/4551 118/725
2018/0174869 A1* 6/2018 Ha .................... H01J 37/32522

FOREIGN PATENT DOCUMENTS

WO 2021/167847 A1 8/2021

OTHER PUBLICATIONS

International Search History, Report and Written Opinion issued in relation to International Application No. PCT/US22/76514.

* cited by examiner

*Primary Examiner* — Joseph A Miller, Jr.

(57) ABSTRACT

A susceptor and susceptor assemblies used in a deposition reactor provides for high throughput while providing tailorable individual heat inputs and minimizes the build-up of errant deposition. The susceptor apparatus heats multiple substrate tapes or sections of a tape within the reactor upon which one or more thin films are deposited, particularly high temperature superconductor (HTS) thin films produced in a MOCVD reactor.

14 Claims, 15 Drawing Sheets

ADVANCED SUSCEPTOR FOR REEL-TO-REEL OPERATIONS

CROSS REFERENCE TO RELATED APPLICATIONS

This application is a national stage application from PCT application PCT/US22/76514 filed Sep. 15, 2022, entitled "Advanced Susceptor for Reel-to-Reel Operations" which claims priority and benefit from U.S. Provisional Patent Application No. 63/246,968 filed on Sep. 22, 2021, also entitled "Advanced Susceptor for Reel-to-Reel Operations" the content of which is incorporated in its entirety herein by reference.

BACKGROUND OF THE INVENTION

Technical Field

Embodiments of the subject matter disclosed herein generally relate to susceptor assemblies and systems utilizing said susceptors within a deposition reactor and more particularly in vapor deposition reactors for fabricating high-temperature superconductors on substrate tapes in reel-to-reel systems.

Discussion of the Background

High temperature superconductors (HTS) provide the potential for development of superconductor components at higher operating temperatures compared to traditional superconductors that operate at liquid helium temperature (4.2K). Superconductors operating at the higher temperatures thus provide the ability to develop superconducting components and products more economically. Thin film HTS material comprised of $YBa_2Cu_3O_{7-x}$ (YBCO), is one of a group of oxide-based superconductors. After the initial discovery of YBCO superconductors, other superconductors were discovered having a similar chemical composition but with Y replaced by other rare earth elements. This family of superconductors is often denoted as REBCO where RE may include Y, La, Nd, Sm, Eu, Gd, Tb, Dy, Ho, Er, Tm, Yb or Lu. This material formed the basis for second generation or "2G" HTS wire technology which provides a more cost-effective material for manufacturing HTS tapes and wires.

Such HTS films are typically deposited as textured REBCO thin films which may include one or more buffer layers onto an atomically textured metal substrate. In the case of MOCVD, an organic ligand may comprise a vapor phase precursor delivered to the substrate for deposition. In the manufacturing of High Temperature Superconductors (HTS) via chemical vapor deposition (CVD) or metal-organic chemical vapor deposition (MOCVD) processing under vacuum conditions, a stainless steel or Hastelloy substrate tape is heated to high temperature, for example, 800° C. to 900° C. for the vapor phase precursor materials to deposit on the substrate tape and HTS film growth to occur.

There are different devices and methods for heating a substrate tape, including IR lamps that heat the tape via radiation, and hot block susceptors that directly contact the substrate tape and provide the needed heat via conduction. A typical CVD reactor 100 is shown in FIG. 1 and includes using a hot block type susceptor 110 that supports and heats a translating substrate tape 120. Reactor 100 is maintained at vacuum via an outlet port 130 and precursor reactant(s) 140 are introduced via a showerhead 150. Radiation lamps 160 may be included to photo enhance thin film 170 growth on substrate 120. A disadvantage to using a heated susceptor 110 in a CVD process is that errant deposition 180 occurs and builds up on the exposed surfaces of the susceptor 110 and other components of the reactor.

Particularly in CVD reactors under vacuum, precursor vapor undergoes expansion and is prone to deposit on exposed surfaces of the susceptor outside the intended target deposition zone on the tape where HTS film growth is desired. Over long process times, the errant material deposited on the susceptor may build up to exceed the tape thickness that may be between 30 to 100 micrometers thickness, for example. Such errant deposition buildup on susceptor surfaces near the tape edges themselves can cause degradation to the properties of the HTS film grown on the tape. For example, the precursor boundary layer flow uniformity on and around the tape may be impacted by errant deposition, e.g., the heat transfer and the radiation properties of the errant material build-up may be different than the HTS film which can cause local edge temperature non-uniformity on the tape; and/or the built-up material itself may break away, become entrained within micro-eddies, and disturb the deposited layers causing performance degradation of the HTS film.

Additionally, build-up of errant deposition material on the susceptor is a major limiting factor in the ability to run continuous and lengthy HTS process runs. For example, errant deposition material build-up may prevent the system from processing kilometers long HTS tapes due to a need to stop processing and disassemble the reactor for cleaning. These fouling issues can become particularly pronounced in high-throughput reel-to-reel processing whereby in order to increase throughput, several adjacent tapes are translated through the deposition zone, or one or more tapes are re-routed to pass through the deposition zone multiple times. FIG. 2 shows an example of CVD reactor 100 with a multi-pass arrangement where a single susceptor 110 heats more than one section of tape 120 as it passes over the susceptor 110 multiple times (five passes are shown) around reels 220 which are fed and taken up by external reels 220. Similarly, multiple separate tapes 120 may be passed over susceptor 110, but in either approach, the spaces on the susceptor surface which are between and around substrate tape or tapes become coated with deposited material.

For these reasons, new susceptor devices, assemblies and systems are needed to improve performance. Improved susceptor designs are thus needed to reduce errant deposition on the susceptor surface and concomitant contamination of the substrate. Additionally, improved susceptor systems should achieve improved uniformity of precursor flow over the substrate tapes; consistent precursor concentration on at each substrate tape; precise temperature control of the substrate tapes; and the ability to tailor power input to individual substrate tapes in multi-pass arrangements.

SUMMARY OF EXAMPLE EMBODIMENTS

According to an embodiment, there is a susceptor assembly for heating and temperature control of a substrate tape within a deposition apparatus. The susceptor assembly includes a bank of two or more adjacent longitudinal susceptors arranged in parallel and separated by a distance, with each susceptor having a width substantially the same or less than the width of a substrate tape and a length substantially the length of a deposition zone within the deposition apparatus. At least one crosswise support member is positioned underneath the bank of susceptors and is configured to vertically align the susceptors and maintain the distance separating adjacent susceptors.

According to another embodiment, there is a susceptor for heating and temperature control of a substrate tape within a deposition apparatus. The susceptor apparatus includes a first conductive body; a second conductive body. The first conductive body is operatively coupled to the second body, and the first conductive body acts as a heater and the second conductive body contacts the substrate tape.

According to another embodiment, there is a susceptor assembly for heating and temperature control of a substrate tape within a deposition apparatus. The susceptor assembly includes a bank of two or more adjacent longitudinal susceptors arranged in parallel and separated by a distance with each susceptor having a width substantially the same or less than the width of a substrate tape and a length substantially the length of a deposition zone within the deposition apparatus. At least one crosswise support member is positioned underneath the bank of susceptors and is configured to vertically align the susceptors and maintain the distance separating adjacent susceptors. Each susceptor further includes a first conductive body coupled to a second conductive body where the second conductive body acts as a heater and the first upper conductive body contacts the substrate tape.

BRIEF DESCRIPTION OF THE DRAWINGS

The accompanying drawings, which are incorporated in and constitute a part of the specification, illustrate one or more embodiments and, together with the description, explain these embodiments. Unless noted otherwise, elements in drawings are not to scale. In the drawings.

DETAILED DESCRIPTION OF EXAMPLES OF THE INVENTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, regarding susceptors, susceptor assemblies and susceptor and reactor systems for deposition of thin films, particularly superconducting coated conductors formed from films deposited on substrate tapes in a CVD and more particularly in a MOCVD reactor. However, the embodiments discussed herein are not limited to such elements. For example, the susceptors and assemblies disclosed herein have application to other reactor types that utilize a susceptor for heating a substrate of any type, and where build-up or errant deposition may be a problem. Such other reactor types may include, but are not limited to, Pulsed Laser Deposition (PLD), Rotating Cylinder Reactor (RCE) and others.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the described features, structures or characteristics may be combined in any suitable manner in one or more embodiments.

Figure 3A:
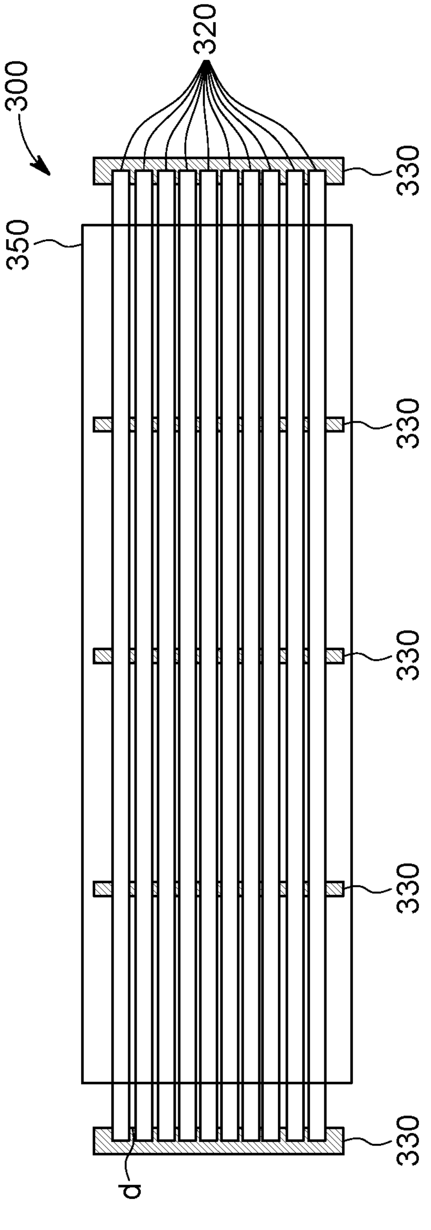
FIGS. 3A and 3B show an exemplary susceptor assembly.
Figure 3B:
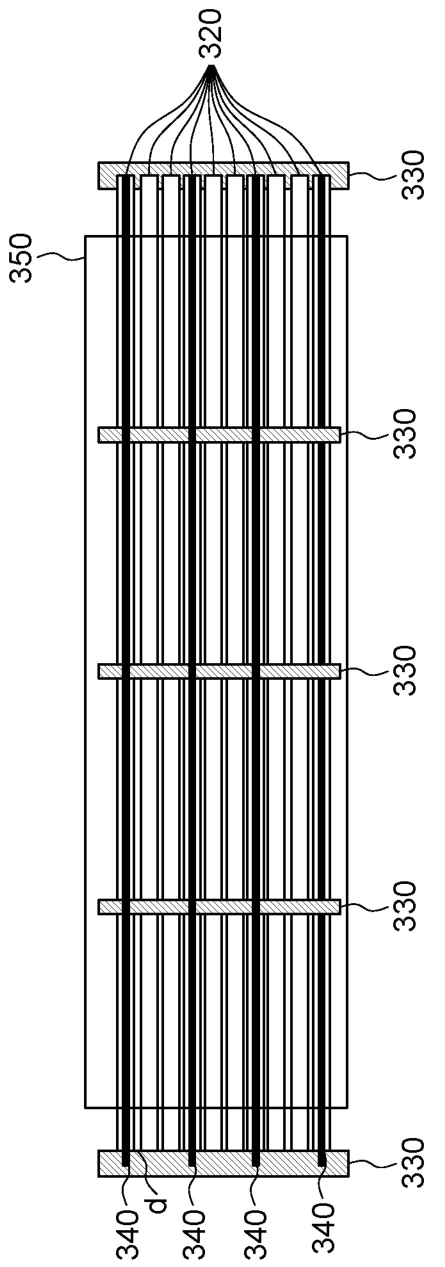
Figure 4A:
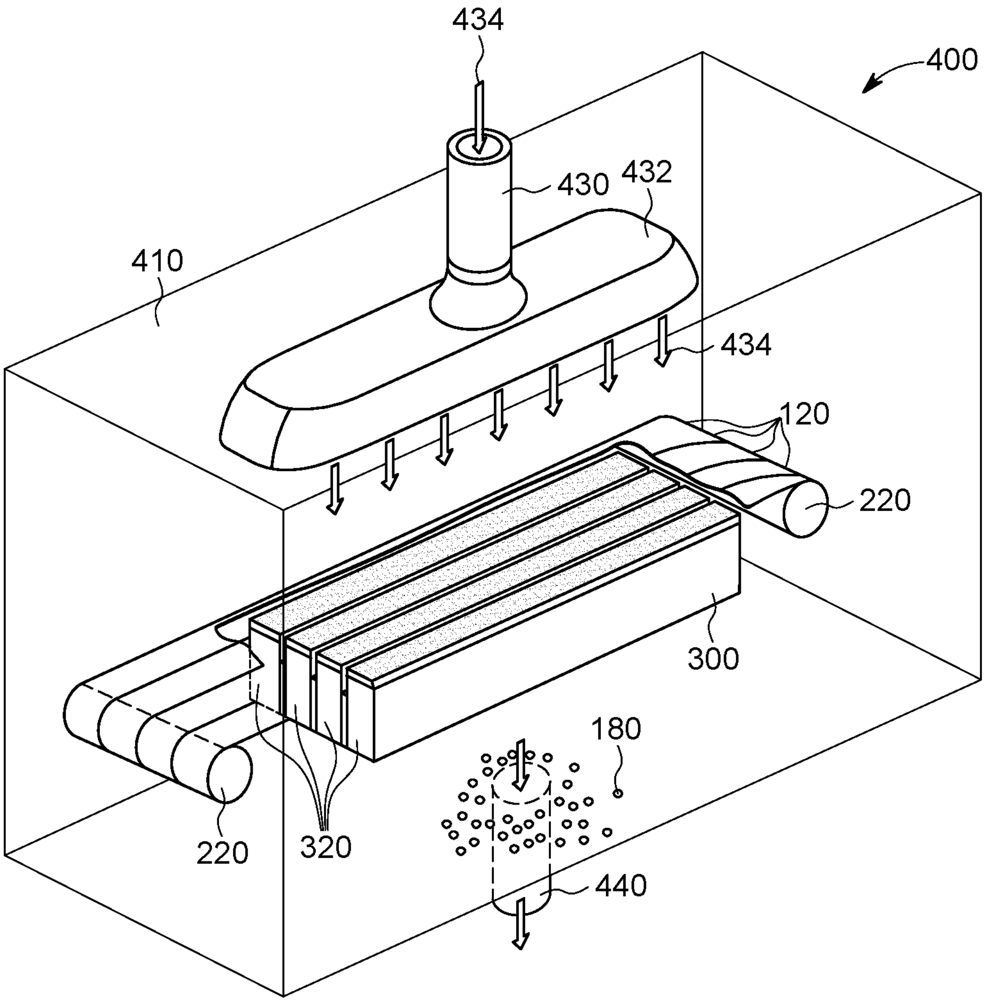
FIGS. 4A and 4B show an exemplary reactor employing an exemplary susceptor assembly.

An exemplary susceptor assembly for high-throughput reel-to-reel deposition operations with errant deposition control and temperature control of the substrate tape or tapes is shown in FIGS. 3A and 3B. FIG. 3A gives a top view and FIG. 3B a bottom view of susceptor assembly 300 with a bank of adjacent longitudinal susceptors 320 arranged in parallel where each individual susceptor 320 is separated from an adjacent susceptor 320 by a distance "d". Ten susceptors 320 are shown as one example but the number may be as few as two or more than ten susceptors. During deposition processing, each susceptor 320 will support a separate substrate tape 120 that in preferred embodiments is substantially the same or slightly greater than the width of the susceptor 320. For example, susceptor 320 may be 10 millimeters in width and the substrate tape 120 also 10 millimeters wide or 12 millimeters in width. In this manner, substrate tape 120 contacts and is heated by its paired susceptor 320 as it translates through the deposition zone 350 within the deposition reactor (FIG. 4A, 400). Further, not all lanes may be utilized, i.e., one or more susceptors 320 in the assembly bank 300 may not serve a substrate tape 120. For example, the two outer lanes may include heated susceptors for the purposes of minimizing heat loses from the inner lanes, and thus not necessarily support susceptor tapes 120 on those lanes.

The bank of susceptors 320 is supported by two or more crosswise support members 330 positioned underneath the bank of susceptors 320 which may be comprised of thin metallic or ceramic cylindrical rods or rectilinearly shaped members. To be discussed in greater detail below, the crosswise support members 330 set the vertical orientation of the bank of susceptors 320 within the deposition reactor (FIG. 4A, 400) as well as set and maintain the spacing "d" between adjacent susceptors 320. The required number of crosswise support members 330 is determined by the thickness and hence the stiffness of the susceptors 320 with stiffer susceptors requiring fewer supports. The crosswise support members 330 may also include and be fixed to one or more parallel support members 340 (FIG. 3B) that run parallel to the susceptors 320 and connect crosswise support members 330 together to form a support platform with open through spaces.

An exemplary reactor system 400 for controlling the temperature of more than one substrate tapes 120 or tape sections in a multi-pass arrangement employing a susceptor assembly 300 described above is shown in FIG. 4A. In preferred embodiments for High-Temperature Superconductor (HTS) production, system 400 is comprised of a reactor housing 410 operated under vacuum conditions. An inlet 430 and showerhead system 432 is included for the delivery of one or more precursors 434, e.g., a metal organic compound from an external source (not shown) which could be a direct liquid injection vapor source, or a solid precursor feed system as disclosed in U.S. Pat. No. 11,162,171 entitled "Solid Precursor Feed System for Thin Film Depositions" which is assigned to the present Applicant and is incorporated by reference herein for all purposes.

In reactor system 400, the bulk of excess or undeposited material 434 exits through one or more vacuum exhaust ports 440, however, as discussed prior, errant material 180 deposits and builds up on various surfaces within the reactor. In the present system, a susceptor assembly 300 as described above mitigates the build-up of errant material 180 located on the susceptors 320 near the substrate tapes 120. Thus, susceptor assembly 300 which includes multiple separated individual susceptors 320 connected by cross (330) and parallel (340) support members is positioned within reactor housing 410. In preferred embodiments, susceptors 320 are configured to be heated by resistive type heaters (not shown) to be discussed below.

Figure 4B:
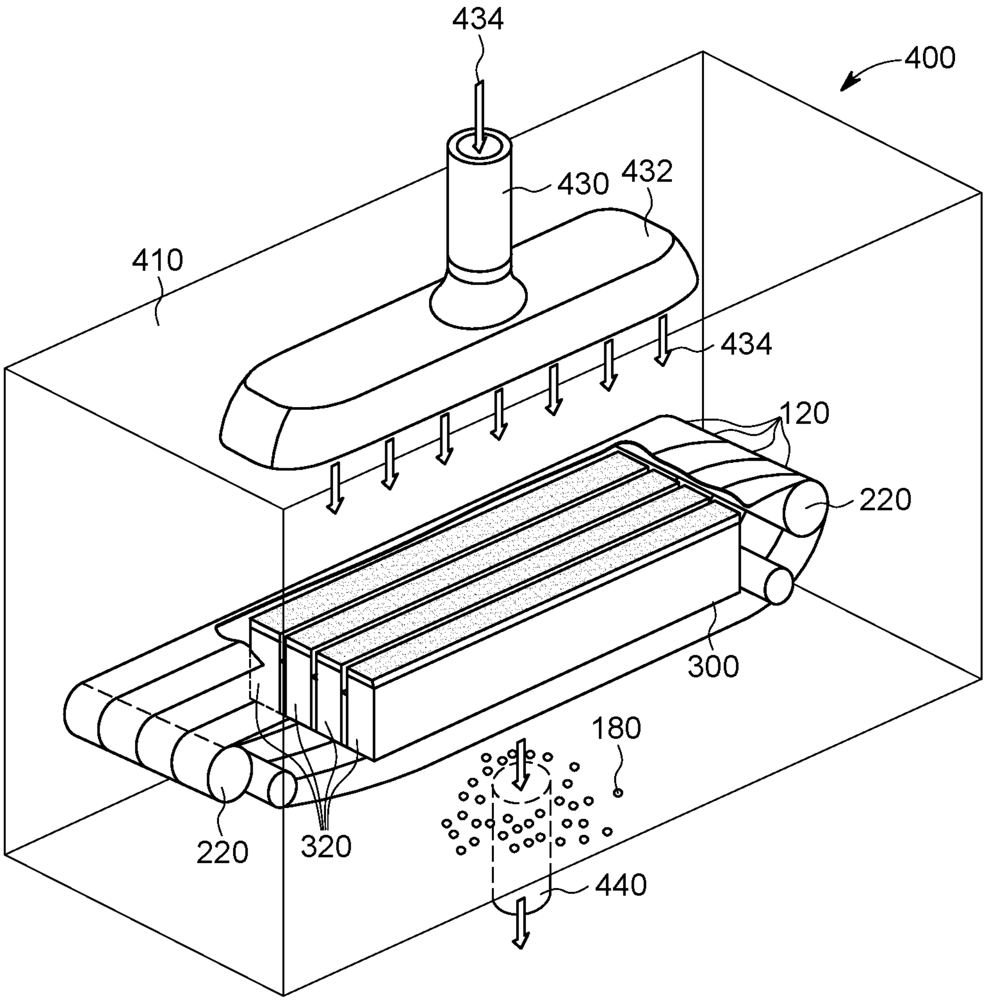

In this system embodiment of FIG. 4A, susceptor assembly 300 is shown to support four substrate tapes 120 (depicted as transparent in order to show susceptor details underneath the tapes). However, as discussed prior, the susceptor assembly 300 may be comprised of any number of susceptors 320 greater than two where each susceptor is spaced apart from an adjacent susceptor by a distance (d) and each susceptor is capable of supporting an individual substrate tape 120. FIG. 4A depicts an exemplary system with a bank of four susceptors 320 with four separate substrate tapes 120 reeled between payout and take-up reels 220, however the same four susceptor bank could serve a single substrate tape re-routed in a four-pass system as shown in FIG. 4B.

Additionally, multiple banks of spaced apart susceptor assemblies 300 described herein could be included in a single reactor in various arrangements, e.g., a dual bank with each bank arranged either inline or side by side, or a matrix of three or four banks arranged horizontally and vertically. Pending PCT Patent Application PCT/US2022/17868 entitled "Multi-Stack Susceptor CVD Reactor for High-Throughput HTS Tape Manufacturing" and assigned to the present Applicant describes various reactor configurations and is incorporated herein by reference for all purposes.

Also, as shown, reels 220 used in single or multi-pass configurations may be located inside the reactor 410. However, substrate tape(s) 120 may also be fed and gathered external to reactor housing 410 via external payout and take-up reels or rollers 220 whereby substrate tapes(s) 120 pass through a narrow slit in the reactor housing 410.

Figure 1:
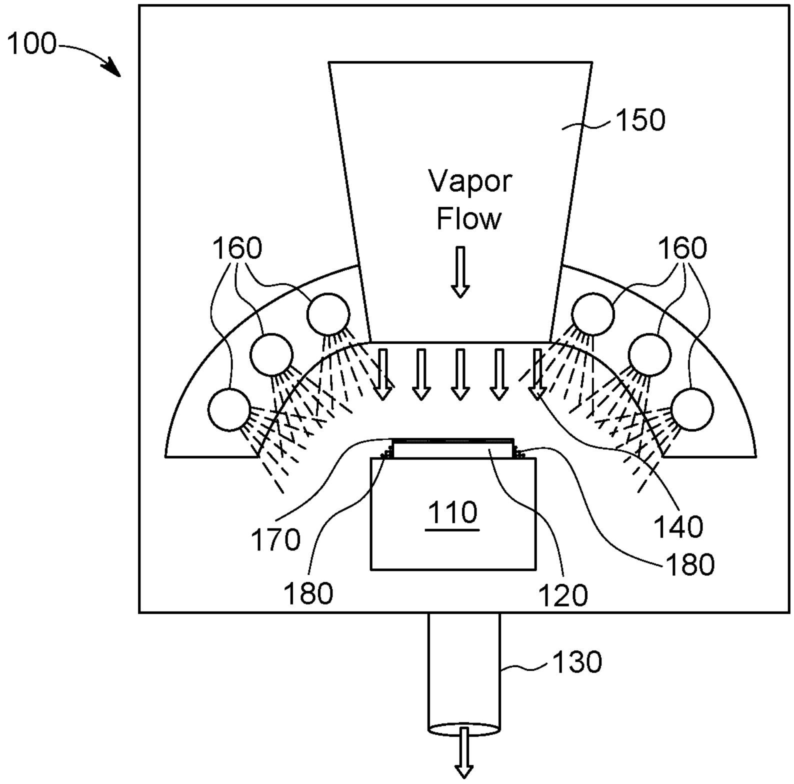
FIG. 1 (Background Art)
FIG. 1 shows a CVD reactor with errant deposition at the susceptor for background.
Figure 2:
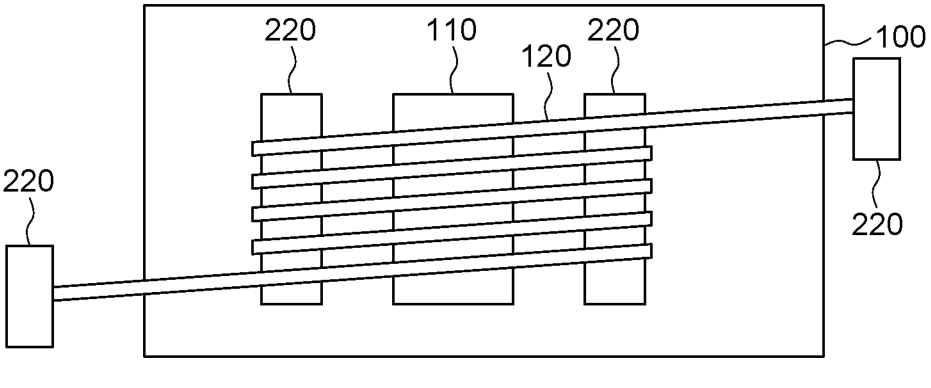
FIG. 2 (Background Art)
FIG. 2 shows a CVD reactor with a multi-pass substrate tape on a single susceptor for background.

Returning to FIGS. 3A and 3B, the spacing d between susceptors 320 may be, for example, a few millimeters to several millimeters, or 10 or more millimeters and serve to provide open spaces for errantly deposited material to pass through thus maintaining substrate tape 120 edges in a clean condition. Further, vacuum pulling from the exhaust port(s) 440 pull the errant material out from between susceptors 320 through the through spaces in the support platform thus minimizing buildup in between susceptors 320. Contrasted with other multi-tape or multi-pass system (see e.g., FIG. 2) which rely on a single susceptor to heat all tapes or sections of tape; the presently disclosed apparatus and system avoids or minimizes substrate contamination arising from errant deposition on the susceptor surfaces and in between substrate tapes.

Figure 5A:
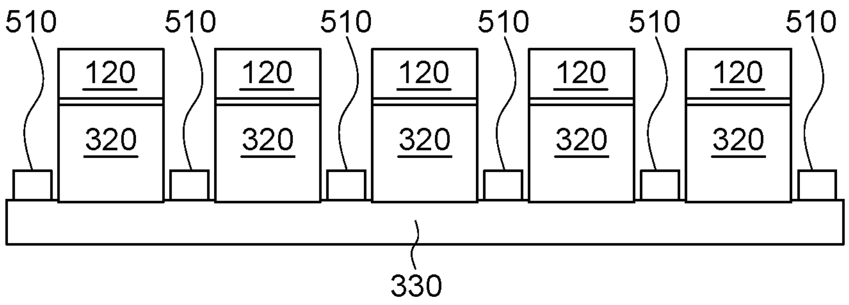
FIGS. 5A and 5B show an additional exemplary susceptor assembly.
Figure 5B:
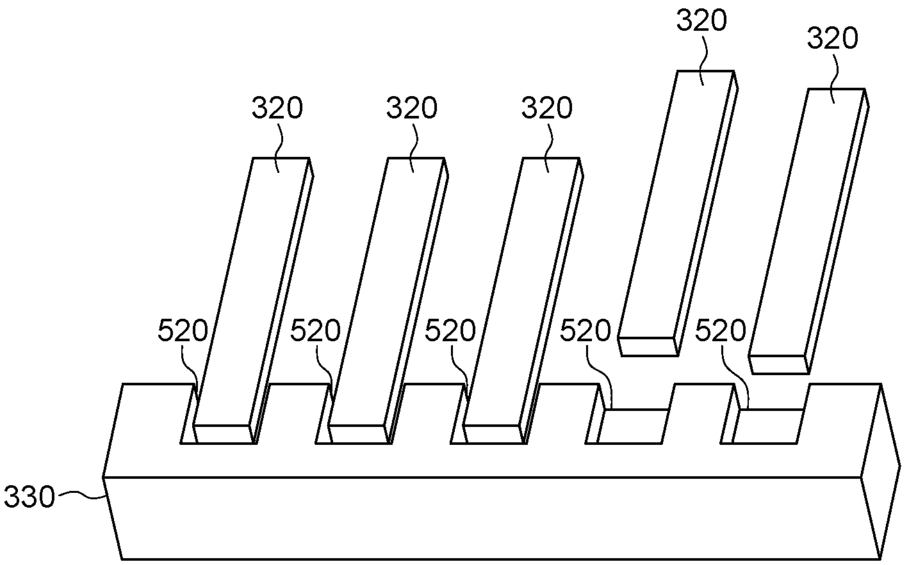

As discussed above, crosswise support members 330 combined with parallel support members 340 provide a support platform with through spaces for susceptors 320. In order to set spacing distance d between adjacent susceptors 320, susceptors may be mechanically coupled to the crosswise support members 330 via use of screws, spot welds, or high-temperature epoxies, etc. However, susceptors 320 may sit upon the crosswise support members 330 without rigid mechanical coupling thus relying upon their weight as well as substrate tape 120 tension to maintain their position. In a preferred embodiment as shown in FIG. 5A, crosswise support members 330 may include tabs or guides as a spacer 510 positioned on an upper surface of the support member and comprised of a width approximating the desired spacing "d". Such spacers 510 may be attached or machined or forged with the support member as a single piece. Since translating substrate tapes 120 may tend to shift the lateral position of a susceptor 320 that is not mechanically coupled, the two outermost crosswise support members may be made thicker to permit a pocket 520 for each susceptor 320 to rest in as shown in FIG. 5B.

Figure 6:
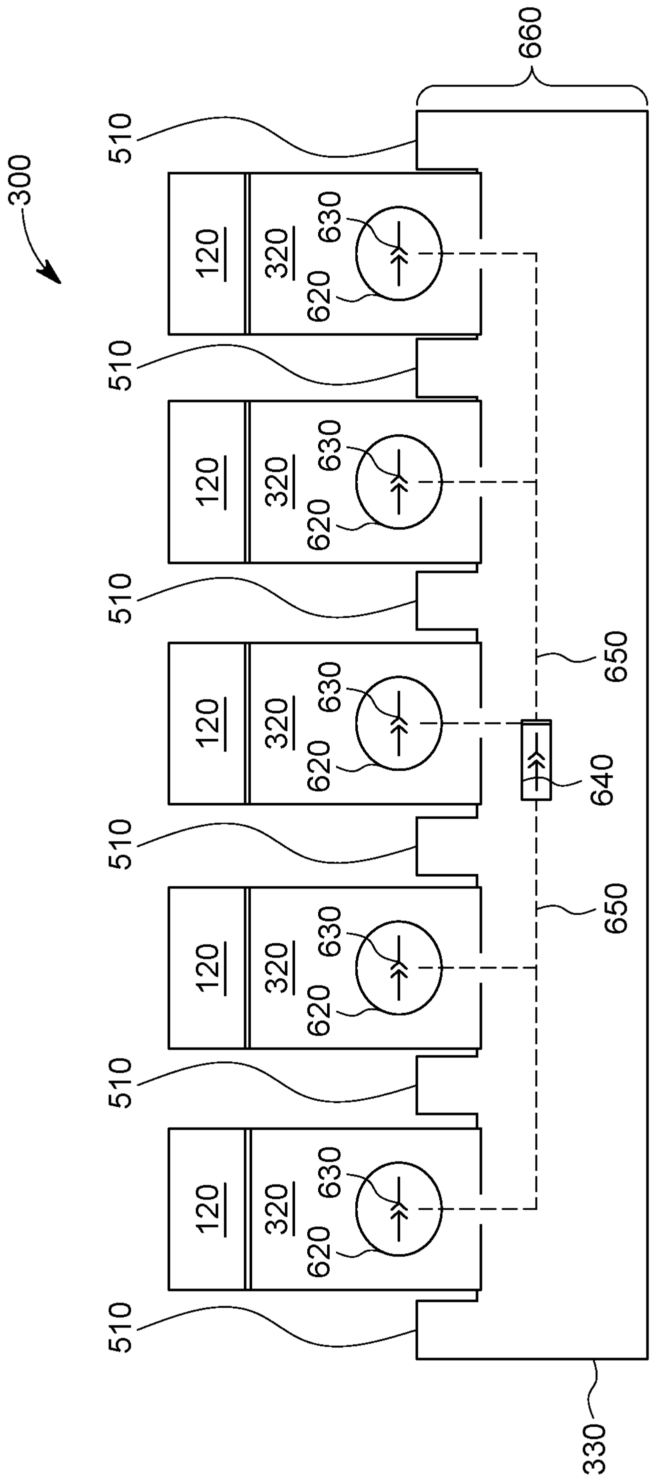
FIG. 6 shows exemplary susceptor assembly with electrical and thermal control features.

In certain preferred embodiments, susceptor assembly 300 may include susceptor heaters and electrical connectivity elements. As shown in FIG. 6, each susceptor 320 of the susceptor assembly 300 may contain an integrated heater element 620 which may be a resistive (electrical) type with each having an electrical connector 630 comprised of, for example, a plug, jack, pin connector or solder point etc. In certain preferred embodiments, connections 630 to each heater element 620 is made internally through one or more of the crosswise support members 330. A common connector 640 at one end of a support member 330 which is configured for connection opposite to a heater controller (discussed below) comprises distributed connection lines 650 that extend internally through a support member 330 to each heater connector 630. Distributed connection lines 650 are shown internal to support member 330, thus making the support member 330 act as an electrical bus bar 660. However, electrical bus bar 660 may be separate and run along the width of susceptor assembly 300 exteriorly to member 330 and provide direct connection via connectors 630 to each heater element 620.

Figure 7A:
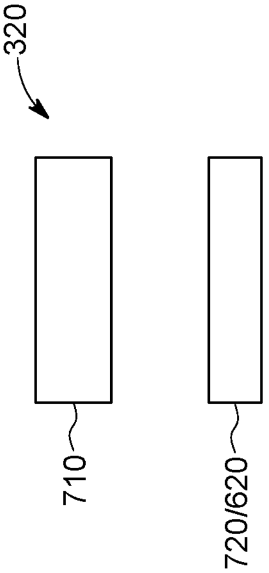
FIGS. 7A-E show exemplary multi-component susceptors.

Each individual susceptor 320 may be comprised of more than one component. FIGS. 7A-7E show five exemplary multi-component susceptors 320 each in expanded view. FIG. 7A depicts a two-part susceptor 320 with a first conductive body 710 as the top portion that contacts substrate tape 120 and a second conductive body 720, as the bottom part that acts as the heater 620. (In describing these susceptor components, certain terms such as "component", "body", "section", "part", or "portion" may be used interchangeably.) In each of these embodiments, the separate components (e.g., 710, 720) can be of the same materials, for example Inconel®, or may be made of separate materials, for example the top portion composed of silicon carbide and the bottom portion being Inconel®, or either or both components may be composed of stainless steel, aluminum, another alloyed metal, or a ceramic material such as aluminum oxide.

Figure 7B:
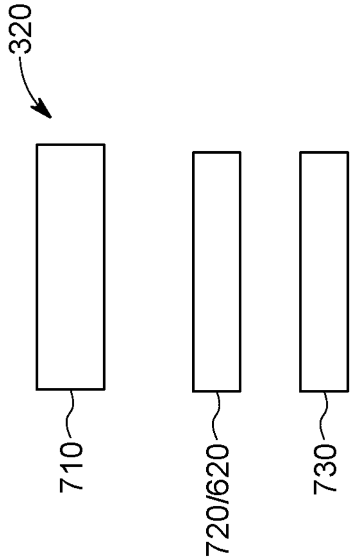

FIG. 7B shows a three-part susceptor 320 where the third component 730 acts as a thermal insulator and is positioned below the heater (as shown) or may enclose the lower portion of the second conductive body 720. Thermal insulators suitable for high temperature applications may include, for example, certain low conducting ceramics, fibrous, glassy or high-temperature polymeric materials. Thermal conductivities of the components may be tailored to optimize thermal conditions, for example, the upper first conducting body 710 may be composed of a high thermally conductive material such as silicon carbide (SiC) with a high radiation emissivity and thus act as a black body to efficiently heat the substrate tape 120; while a lower component (720/730/750/760) may be composed with a low conductivity material, e.g., an insulating high temperature ceramic.

Figure 7C:
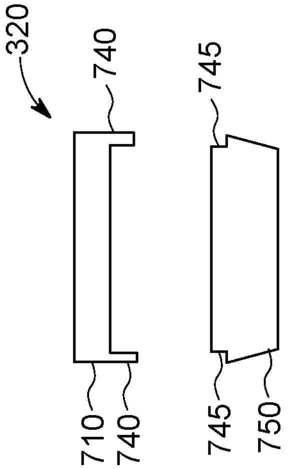
Figure 7D:
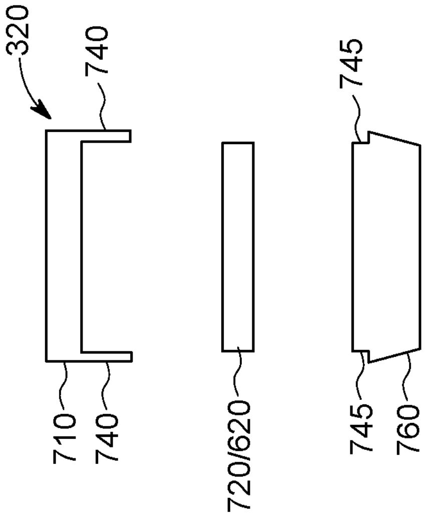

Methods of mating or coupling the different components may include physical, mechanical and/or chemical approaches. FIG. 7C illustrates an embodiment wherein fingers or other protrusions 740 of the upper conductive body 710 extend onto shoulders 745 or cutouts located on an upper portion of shaped conductive body 740 that is configured to receive the first upper conductive body 710. In the embodiment of FIG. 7C, shaped conductive body 750 serves as the second conductive body 720 that also acts as a heater 620. In the alternative three component susceptor 320 embodiment of FIG. 7D, a shaped third insulating body 760 may act as an insulator and may also be similarly configured to receive fingers or protrusion 740 of the first upper conductive body 710. In this embodiment (FIG. 7D), the second conducting body 720 is enclosed by the third insulting body 760 when coupled or mated to the first conducting body 710.

Figure 7E:
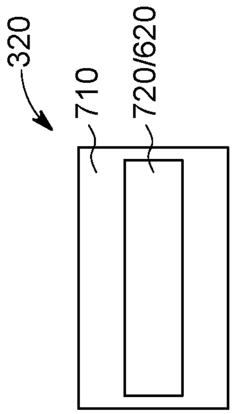

In another embodiment, first conducting body 710 may itself encapsulate second conductive body 720 as shown in FIG. 7E. In this context, "encapsulate" shall include partially enclose wherein at least three sides may be enclosed, but four, five or all six sides of a rectilinear shaped second conductive body 720 or heater 620 may be fully enclosed. However, the embodiments described herein are not limited to rectilinear components. Referring to FIG. 6, susceptor 320 may be comprised of a rectilinear first body that encapsulates a cylindrical heater 620, thus in this context "encapsulate" refers to enclosing the length of the cylinder and may include enclosure of one or both ends of the cylinder.

Figure 8B:
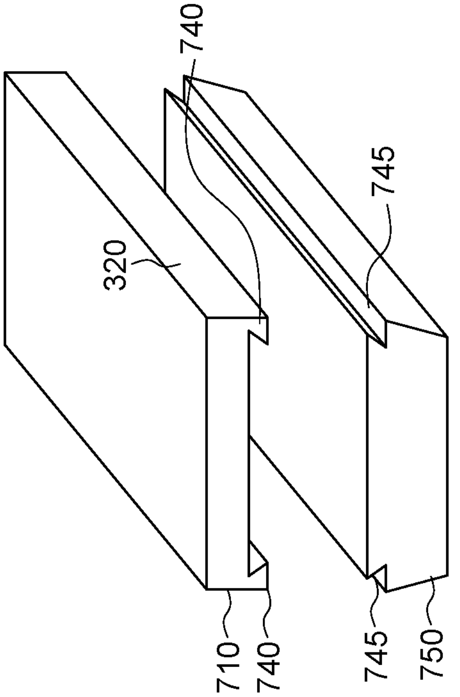
FIGS. 8A and 8B show additional exemplary multi-component susceptors.
Figure 8A:
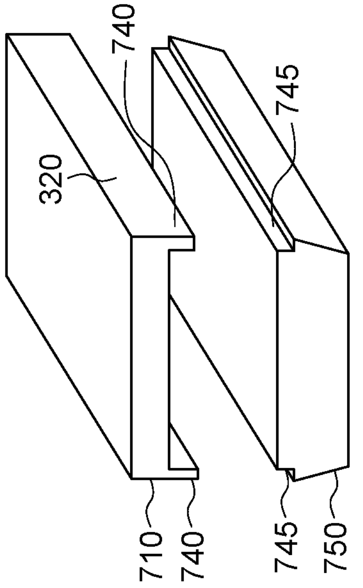

The components may be joined together using mechanical fasteners, such as screws, or welds, or use of high temperature epoxies. Alternatively, highly polished mating surfaces of different components machined or formed with tight tolerances may rely upon simple gravimetric contact. FIGS. 8A and 8B illustrate the joining of a multi-component susceptor 320 parts as shown in FIGS. 7A-7E. FIG. 8A depicts the two components of FIG. 7C coupled whereby a second or lower component (750 is shown) slidably receives first conductive body 710 via mating of protrusions 740 with shoulders 745. Thus, joining of components may be gravimetric, and/or the two components may be secured via high temperature compounds between the components or by mechanical fasteners such as screws. Additionally, as shown in FIG. 8B, protrusions 740 may have various shapes configured to be received into similarly shaped shoulders 745. Such shapes may aid contact between gravimetrically mated components and in the case of where one component material may be malleable, the two parts may be snap fitted together as well.

Figure 9:
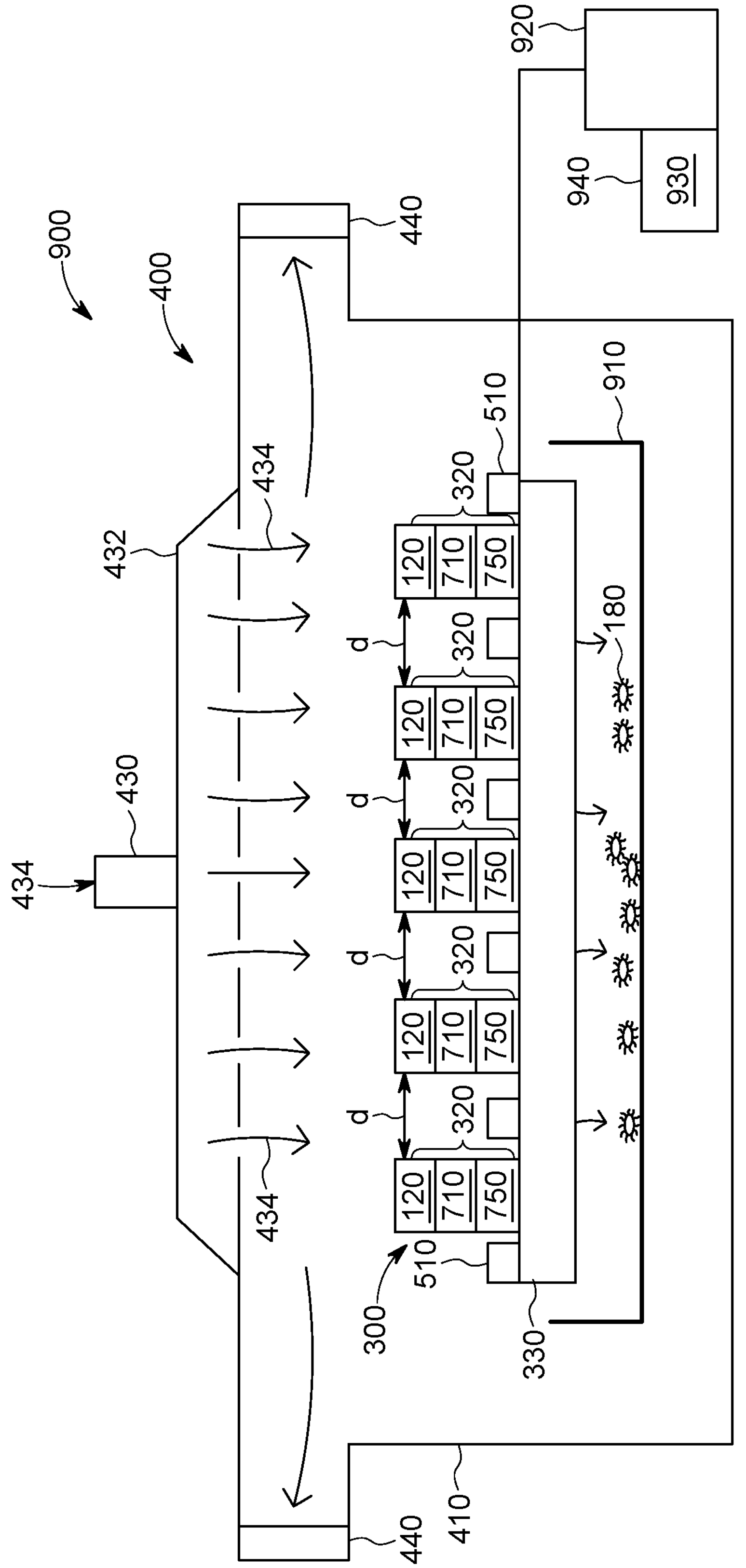
FIG. 9 shows an exemplary reactor and reactor system employing an exemplary susceptor assembly.

FIG. 9 provides a 2D representation of an exemplary reactor 400 and reactor system 900 utilizing multi-component versions of susceptors 320. In this example, a two component susceptor is shown comprised of first (upper) conductive body 710 joined or mated as described above to a lower second conductive body 750. It is to be understood that any of the aforementioned embodiments of one, two, three or more component susceptors 320 may be employed. Each susceptor 320 supports an individual substrate tape 120 and is spaced apart from adjacent susceptors 320 by a distance "d". Take-up and payout reels 220 are not shown for clarity, but in this example would be positioned in and out of the page, either internal or external to reactor 400. Substrate tape 120 may thus be five separate tapes or a single tape in a five-pass configuration in this example. Susceptor assembly 300 is housed within reactor housing 410 or reactor system 400 into which precursor(s) 434 are introduced via inlet 430 and through showerhead 432. In this example, vacuum outlet ports 440 are positioned on an upper portion of reactor housing 410 but it is be understood that such outlets may be located on a base of the reactor (see e.g., FIG. 4A/B) or other location. As depicted, undeposited precursor material 434 flows through spaces "d" between susceptor assemblies 300 and through the open platform created by cross and parallel support members 330/340. This errant material 180 may then be captured in an optional collector 910, which in this example is configured as a pan shaped housing open at the top and positioned below susceptor assemblies 300.

The susceptor assembly 300 also comprises crosswise support members 330, and in this example, an end crosswise member 330 is shown and also includes spacers 510 which sets spacing "d". (Not shown for clarity are parallel support member(s) 340.) Crosswise support member 330 in this embodiment includes an integrated electrical bus apparatus 660 as previously described. (Connectors 640 and 630, and connection lines 650 are not shown for clarity.) Bus apparatus 660 provides electrical connectivity between heaters (710/620) and an external heater controller 920 configured to receive one or more thermal inputs (e.g., via standard thermocouples) from heaters 620 or from other locations within reactor 400 including from individual substrate tapes 120 which may be thermally monitored by contact thermocouples or non-contact infrared measurements. A data processing algorithm 930 is typically implemented as software code on a programmable automation controller (PAC) or Programmable Logic Controller (PLC) 940 and is configured to calculate and send electrical signals via heater controller 920 to individual heaters 620 of susceptor assemblies 300. In this reactor system 900 and associated methods, each susceptor 320 may be monitored and individually thermally controlled.

Figure 10A:
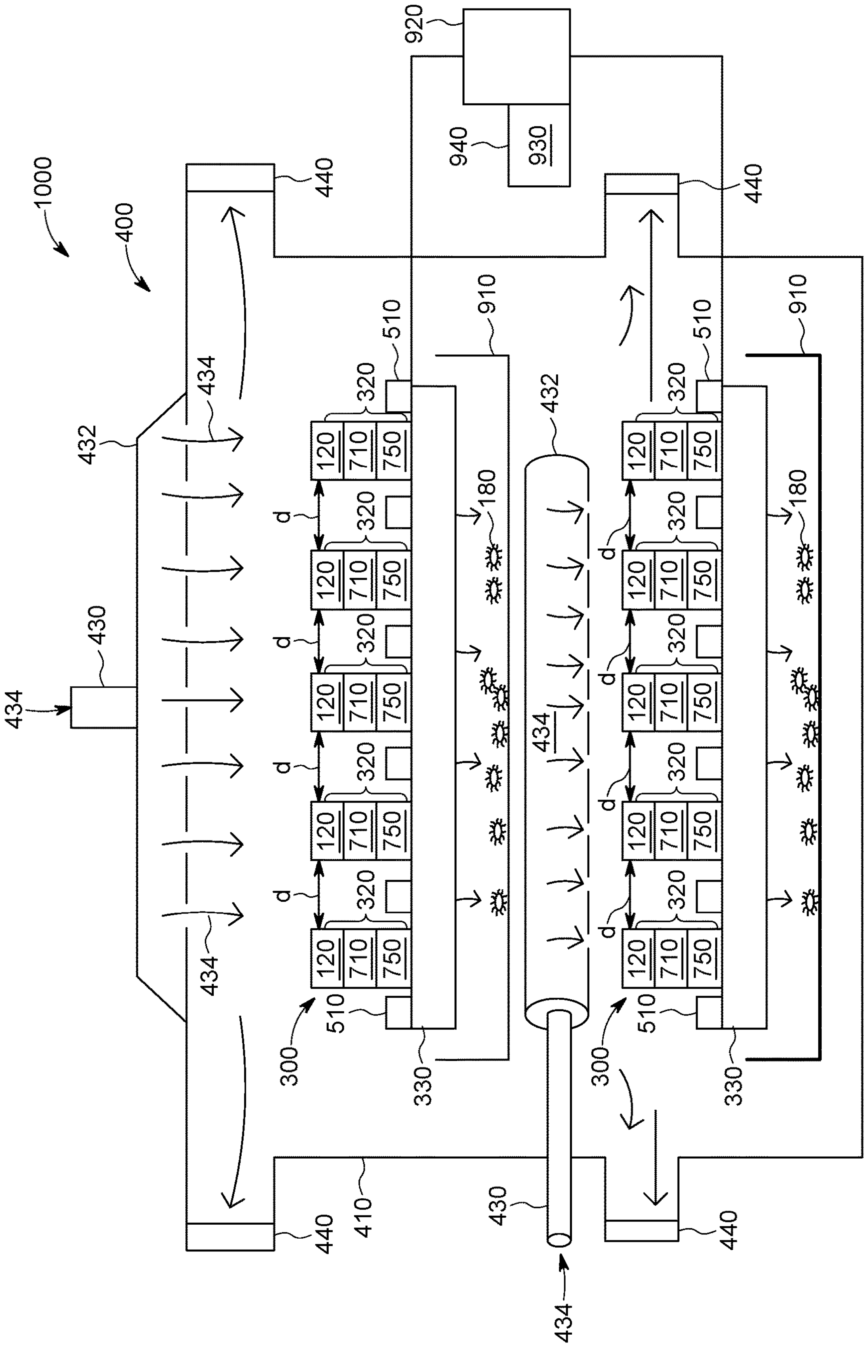
FIGS. 10A and 10B show additional exemplary reactors and reactor systems employing an exemplary susceptor assembly.
Figure 10B:
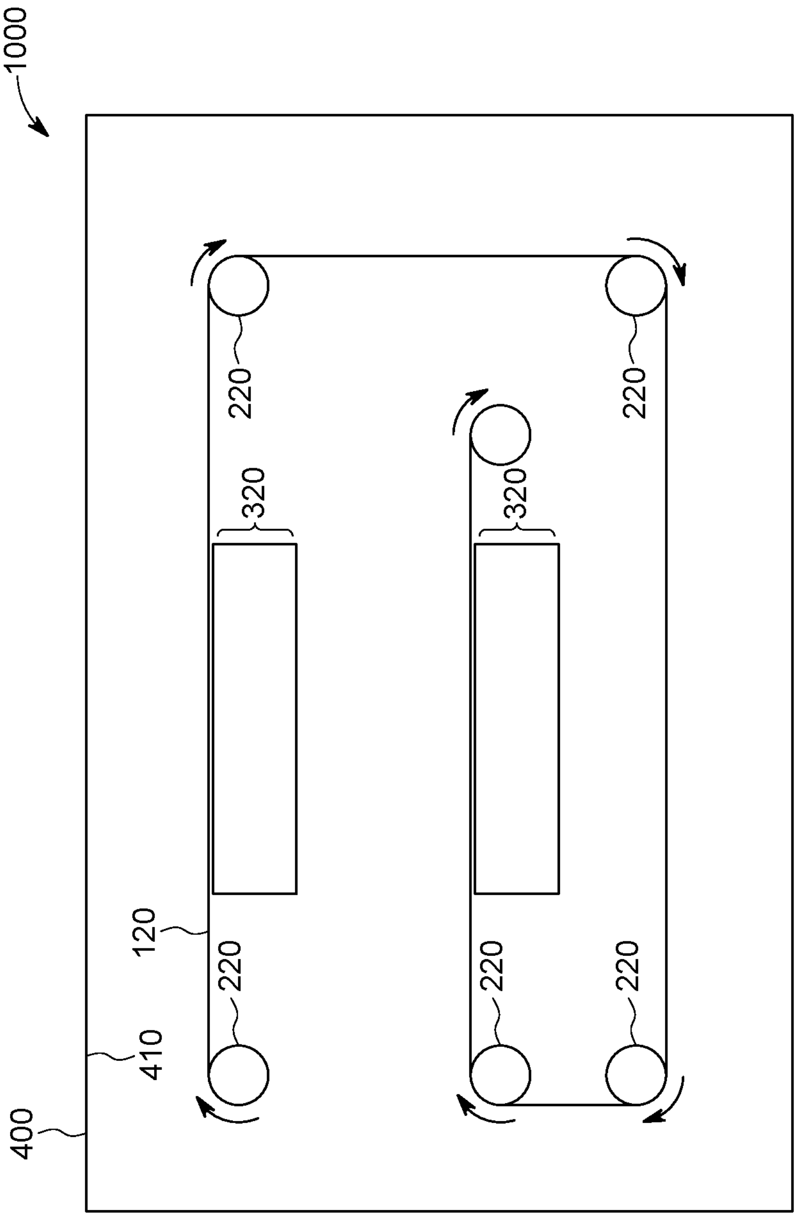

As discussed above, multi-stack arrangements of more than one susceptor assemblies 300 of the present invention contained within a single reactor 400 are possible to enable additional throughput gains while maintaining errant deposition control and individual susceptor thermal control. An exemplary multi-stack reactor 400 and reactor system 1000 is given in FIG. 10A. In this embodiment, five separate tapes 120 may each pass two susceptors (300/320), thus effectively doubling deposition zone residence time as compared to a single bank of susceptors. With this approach, the upper collector 910 becomes necessary to protect the lower substrate tapes 120 during deposition. Alternatively, a single substrate tape 120 may reroute via a series of take-up and payout reels 220 (not shown) and contact ten susceptors 320 to achieve a single tape, ten-pass system. FIG. 10B illustrates an exemplary reel-to-reel configuration for the reactor system 1000 given in FIG. 10A shown as rotated out of the plane of the page by 90 degrees with reduced detail to show additional features of a series of reels or rollers 220. Reels/rollers 220 are shown internal to reactor housing 410 but may be externally positioned or a combination of internal and externally placed. In this configuration, substrate tape(s)

120 translate over two vertically arranged banks of susceptors 320. In this rotated 2D depiction of FIG. 10A, a total of five substrate tapes 120 would be inline into the page.

Numerous configurations and scale factors employing the susceptor assemblies disclosed herein are feasible. Thus, in this example, for a given deposition zone size, the disclosed embodiments can achieve an order of magnitude throughput increase as compared to a single substrate with a single susceptor reactor system while maintaining individual susceptor thermal control and limiting errant deposition.

Figure 11:
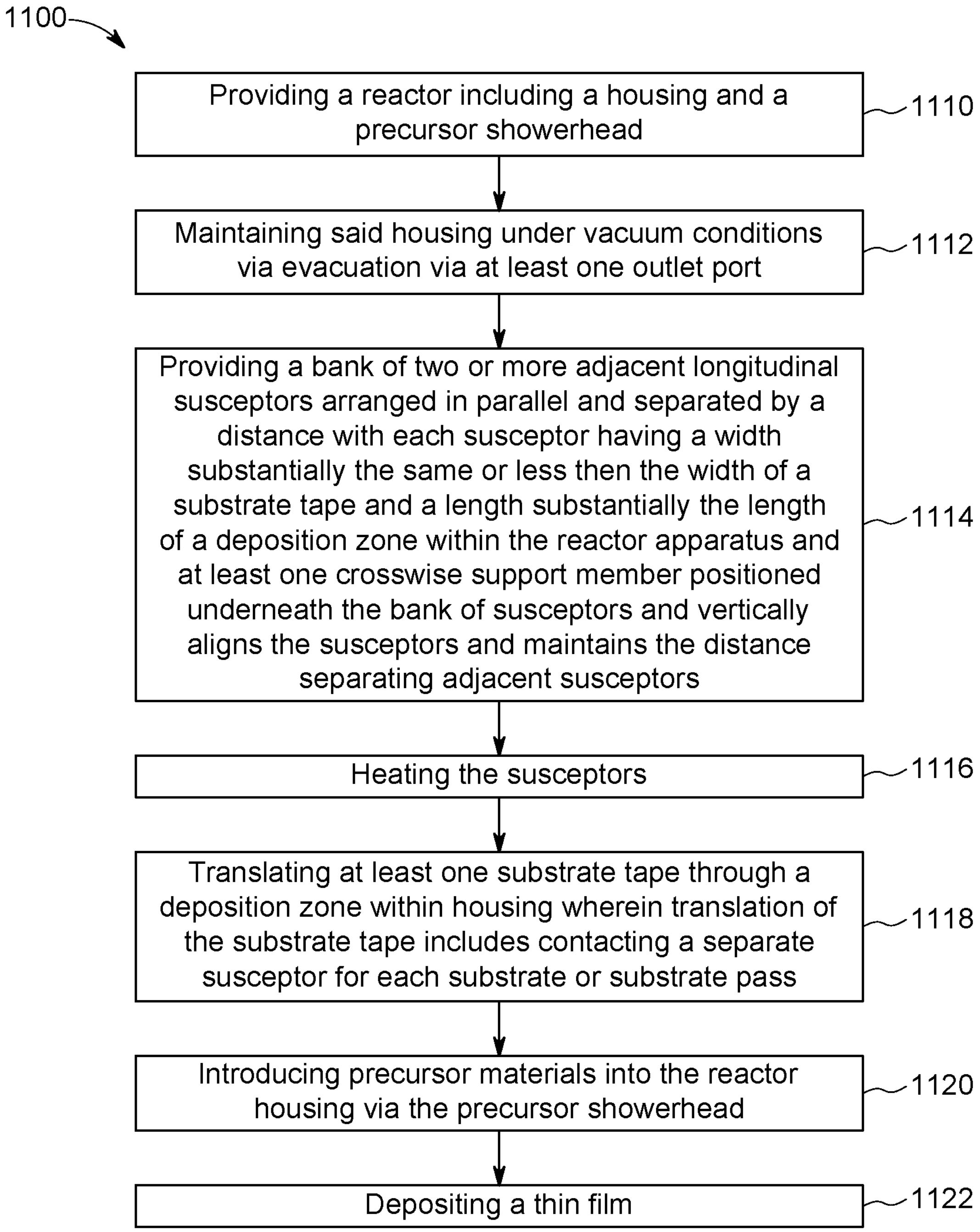
FIGS. 11-13 show exemplary methods for depositing thin films utilizing the susceptors and susceptor assemblies

An exemplary method of production of deposited products in reel-to-reel operations utilizing the susceptors and susceptor assemblies disclosed herein will now be discussed with reference to FIG. 11. The method 1100 includes the steps of: a step 1110 of providing a reactor 400 which includes a reactor housing 410 and a precursor showerhead 432; a step 1112 of maintaining said housing under vacuum conditions via evacuation via at least one outlet port 440, a step 1114 of providing at least one bank of two or more adjacent longitudinal susceptors 320 arranged in parallel and separated by a distance with each susceptor 320 having a width substantially the same or less than the width of a substrate tape 120 and a length substantially the length of a deposition zone 350 within the reactor apparatus 400 and at least one crosswise support member 330 positioned underneath the bank of susceptors and vertically aligns the susceptors and maintains the distance separating adjacent susceptors; a step 1116 of heating susceptors 320; a step 1118 of translating at least one substrate tape 120 through a deposition zone within housing 410 wherein translation of the substrate tape 120 includes contacting a separate susceptor 320 for each substrate or substrate pass; a step 1120 of introducing precursor materials 434 into the reactor housing 410 via the precursor showerhead 430, and a step 1122 of depositing a thin film, e.g., YBCO.

Figure 12:
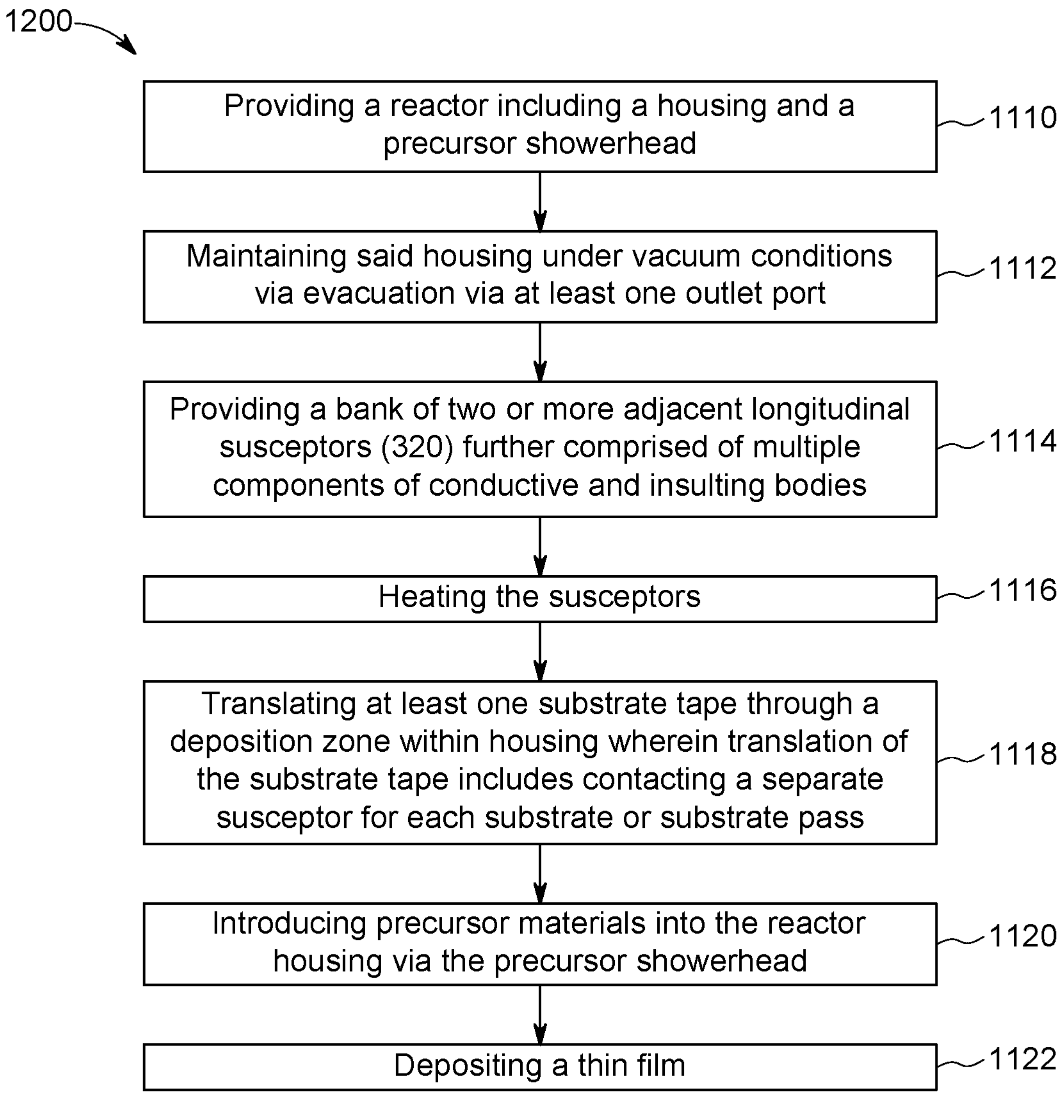

In another application illustrated in FIG. 12, a method 1200 may include method 1100 steps above wherein the bank of susceptors 320 is comprised of a first conductive body 710 coupled to a second conductive body 720, and wherein the second conductive body acts as a heater 620 and the first upper conductive body contacts the substrate tape 120.

Figure 13:
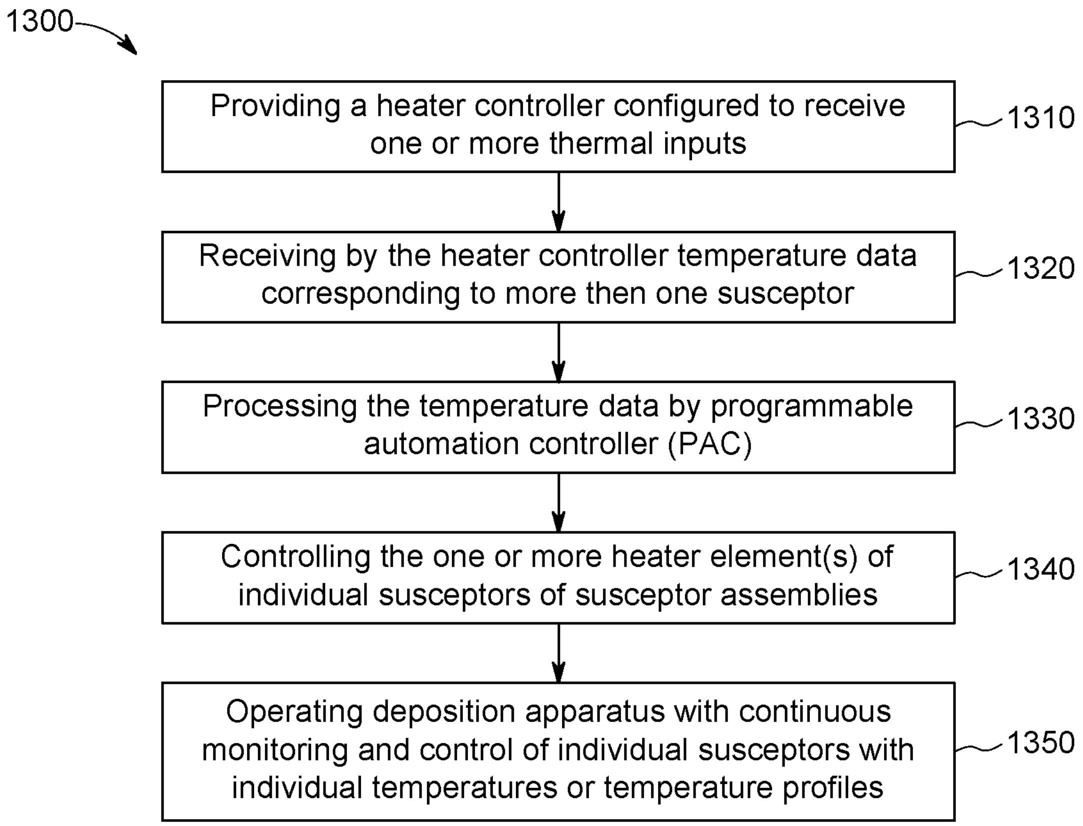

The methods described above may further include additional steps of achieving variable deposition conditions; including individual thermal conditions for each susceptor 320 and is illustrated in FIG. 13. In these applications, the method 1300 includes the steps of methods 1100 or 1200 and additionally includes a step 1310 of providing a heater controller 920 configured to receive one or more thermal inputs; a step 1320 of receiving by the heater controller 920 temperature data corresponding to more than one susceptor 320; a step 1330 of processing the temperature data by programmable controller (PAC/PLC) 1120; a step 1340 of controlling the one or more heater element(s) 620 of individual susceptors 320 of susceptor assemblies 300 based on the thermal input data and a target temperature or temperature profile for individual susceptors 320; and the step 1350 of operating deposition apparatus 400 with continuous monitoring and control of individual susceptors 320 with individual temperatures or temperature profiles.

The description provided herein discloses examples of the subject matter pertinent to improved production of deposited products, in particular High-Temperature Superconductors (HTS). The examples provided herein are intended to enable those skilled in the art to practice the same, including making and using any apparatus, system and performing the methods described in any combination. The patentable scope of the subject matter is thus defined by the claims and may include other examples that fall within the scope of the claims that occur to those skilled in the art having the benefit of the present disclosure.

What is claimed is:

1. A susceptor assembly for heating and temperature control of a substrate tape within a deposition apparatus, the susceptor assembly comprising:
- a bank of two or more adjacent longitudinal susceptors arranged in parallel and separated by a distance, and each susceptor having a width substantially the same or less than the width of a substrate tape and a length substantially the length of a deposition zone within the deposition apparatus;
- at least one crosswise support member positioned underneath the bank of susceptors and configured to vertically align the susceptors and maintain the distance separating adjacent susceptors and
- wherein the support member further comprises a spacer disposed upon an upper surface of at least one of the support members and configured to maintain the separation distance between adjacent susceptors of the bank of susceptors.

2. The susceptor assembly of claim 1, wherein the support members are mechanically coupled to each susceptor of the bank of susceptors.

3. The susceptor assembly of claim 1, wherein the support members further comprise electrical connectors.

4. The susceptor assembly of claim 3, further comprising an electrical bus apparatus comprising multiple couplings wherein each coupling is configured to couple to an individual susceptor at one end and to couple to a heater controller at a second end.

5. The susceptor assembly of claim 1, wherein the substrate tape is comprised of multiple substrate tapes wherein each substrate tape passes through the deposition zone of the deposition apparatus a single time with each substrate tape contacting a separate susceptor of the bank of susceptors.

6. The susceptor assembly of claim 1, wherein the substrate tape is a single substrate tape that passes through the deposition zone of the deposition apparatus more than one time with each pass contacting a separate susceptor of the bank of susceptors wherein the number of passes equals the number of susceptors in the bank of susceptors.

7. A susceptor assembly for heating and temperature control of a substrate tape within a deposition apparatus, the susceptor assembly comprising:
- a bank of two or more adjacent longitudinal susceptors arranged in parallel and separated by a distance, and each susceptor having a width substantially the same or less than the width of a substrate tape and a length substantially the length of a deposition zone within the deposition apparatus;
- at least one crosswise support member positioned underneath the bank of susceptors and configured to vertically align the susceptors and maintain the distance separating adjacent susceptors; and
- wherein each susceptor is further comprised of a first conductive body coupled to a second conductive body, and
- wherein the second conductive body acts as a heater and the first conductive body contacts the substrate tape.

8. The susceptor assembly of claim 7, wherein the susceptor further comprises a third non-conducting body that acts as an insulator and is disposed below the first and second bodies.

9. The susceptor assembly of claim 7, wherein the support member further comprises a spacer disposed upon an upper surface of the support member configured to maintain the separation distance between adjacent susceptors of the bank of susceptors.

10. The susceptor assembly of claim 7, wherein the support member is mechanically coupled to each susceptor of the bank of susceptors.

11. The susceptor assembly of claim 7, wherein the support member further comprises electrical connectors.

12. The susceptor assembly of claim 11, further comprising an electrical bus apparatus comprising multiple couplings wherein each coupling is configured to couple to an individual susceptor at one end and to couple to a heater controller at a second end.

13. The susceptor assembly of claim 7, wherein the substrate tape is comprised of multiple substrate tapes wherein each substrate tape passes through the deposition zone of the deposition apparatus a single time with each substrate tape contacting a separate susceptor of the bank of susceptors.

14. The susceptor assembly of claim 7, wherein the substrate tape is a single substrate tape that passes through the deposition zone of the deposition apparatus more than one time with each pass contacting a separate susceptor of the bank of susceptors wherein the number of passes equals the number of susceptors in the bank of susceptors.

* * * * *